US012633929B2

(12) United States Patent
Gruddanti et al.

(10) Patent No.: US 12,633,929 B2
(45) Date of Patent: May 19, 2026

(54) SYSTEMS AND METHODS FOR DRIVER CALIBRATION IN DIE-TO-DIE INTERFACES

(71) Applicant: Advanced Micro Devices, Inc., Santa Clara, CA (US)

(72) Inventors: Srikanth Reddy Gruddanti, Bangalore (IN); Debasish Dwibedy, Bangalore (IN); Manoj N. Kulkarni, Bangalore (IN); Prasant Kumar Vallur, Bangalore (IN); Priyadarshi Saxena, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 103 days.

(21) Appl. No.: 18/466,221

(22) Filed: Sep. 13, 2023

(65) Prior Publication Data

US 2025/0088193 A1     Mar. 13, 2025

(51) Int. Cl.
  *H03L 7/081*     (2006.01)
  *G06F 1/04*      (2006.01)
  *H03K 3/011*     (2006.01)

(52) U.S. Cl.
  CPC .............. *H03L 7/0814* (2013.01); *G06F 1/04* (2013.01); *H03K 3/011* (2013.01)

(58) Field of Classification Search
  CPC ... H03L 7/0814; H03L 7/0816; H03L 7/0812; H03L 7/07; H03L 7/00; H03L 7/0805; H03L 7/081; H03L 7/0807; H03L 7/093; H03L 7/087; H03L 7/0891; H03L 7/0818; H03L 7/18; H03L 7/095; H03L 7/08; H03L 7/091; H03L 7/099; H03L 7/0995; H03L 7/089; H03L 7/0802; H03L 7/085; H03L 7/113; H03L 7/22; H03L 7/23; H03L 7/06; H03L 7/14; H03L 7/1976; H03L 7/1974; H03L 7/235; H03L 2207/06; H03L 7/0991; H03L 7/0994; H03L 7/24; H03L 7/097; H03L 7/10; H03L 2207/14; H03L 7/0992; H03L 7/145; H03L 7/185; H03L 7/0997; H03L 7/16; H03L 7/187; H03L 7/189; H03L 5/00; H03L 2207/50; H03L 7/0893; H03L 7/0996; H03L 7/107; H03L 7/183; H03L 7/083; H03L 7/0998; H03L 7/1075; H03L 7/143; H03L 1/00; H03L 7/0896;

(Continued)

(56) References Cited

U.S. PATENT DOCUMENTS 6,407,601 B1 *   6/2002   Lin ........................ H03L 7/0816
                                                          327/158
6,839,301 B2 *   1/2005   Lin ........................ G11C 29/02
                                                          365/194

(Continued)

*Primary Examiner* — John W Poos
(74) *Attorney, Agent, or Firm* — Greenberg Traurig, LLP

(57) ABSTRACT

A method for driver calibration in die-to-die interfaces can include calibrating a delay lock loop of a delay line unit cell, by at least one processor, based on drive and load conditions of one or more driver unit cells of a physical layer of a die-to-die interconnect. The method can additionally include generating a clock signal, by the at least one processor, based on the delay lock loop. The method can further include communicating data, by the at least one processor, over the die-to-die interconnect based on the clock signal. Various other methods and systems are also disclosed.

20 Claims, 8 Drawing Sheets

800

(58) Field of Classification Search

CPC ... H03L 7/104; H03L 7/20; G06F 1/10; G06F 13/1689; G06F 13/4243; G06F 17/14; G06F 17/142; G06F 12/0246; G06F 3/061; G06F 13/4072; G06F 13/4291; G06F 3/0679; G06F 1/12; G06F 13/4282; G06F 2212/7201; G06F 13/364; G06F 3/0658; G06F 13/4234; G06F 13/4086; G06F 3/0611; G06F 3/0688; G06F 13/4068; G06F 13/4022; G06F 1/06; G06F 1/04; G06F 13/102; G06F 3/0659; G06F 3/0619; G06F 13/1684; G06F 1/08; G06F 12/1081; G06F 2206/1014; G06F 3/0661; G06F 13/1668; G06F 13/1673; G06F 13/1694; G06F 12/00; G06F 1/26; G06F 3/0629; G06F 3/0446; G06F 3/0673; H03K 5/133; H03K 2005/00071; H03K 5/1565; H03K 5/13; H03K 2005/00058; H03K 2005/00039; H03K 2005/00045; H03K 5/135; H03K 3/017; H03K 2005/00019; H03K 2005/00065; H03K 2005/00195; H03K 5/131; H03K 17/6871; H03K 2005/00052; H03K 3/012; H03K 19/1774; H03K 19/20; H03K 2005/00286; H03K 5/00006; H03K 7/08; H03K 2005/00202; H03K 23/665; H03K 5/134; H03K 5/159; H03K 19/00384; H03K 2005/00097; H03K 2005/00221; H03K 5/06; H03K 5/151; H03K 19/173; H03K 2005/00032; H03K 2005/00078; H03K 2005/00208; H03K 3/011; H03K 3/013; H03K 3/0315; H03K 3/0322; H03K 5/01; H03K 5/088; H03K 5/156; H03K 17/163; H03K 17/6872; H03K 19/0005; H03K 2005/00026; H03K 2005/00084; H03K 2005/00104; H03K 2005/00123; H03K 2005/0013; H03K 2005/00143; H03K 2005/00156; H03K 2005/00215; H03K 2005/00234; H03K 2005/00293; H03K 3/01; H03K 3/356121; H03K 3/3565; H03K 5/05; H03K 5/082; H03K 5/14; H03K 5/15033; H03K 5/1504; H03K 5/1515; H03K 5/153; H03K 17/161; H03K 3/027; H03K 3/03; H03K 3/0375; H03K 3/86; H03K 5/00

See application file for complete search history.

(56) References Cited

U.S. PATENT DOCUMENTS

| | | | |
|---|---|---|---|
| 2002/0097074 A1* | 7/2002 | Kim | H03L 7/0816 |
| | | | 327/158 |
| 2011/0050303 A1* | 3/2011 | Ma | G11C 5/02 |
| | | | 327/158 |
| 2013/0099383 A1* | 4/2013 | Meyer-Berg | H01L 23/5226 |
| | | | 257/772 |
| 2014/0104935 A1* | 4/2014 | Ware | G11C 7/1012 |
| | | | 365/233.13 |
| 2018/0101502 A1* | 4/2018 | Nassif | G06F 15/7889 |

* cited by examiner

200

300

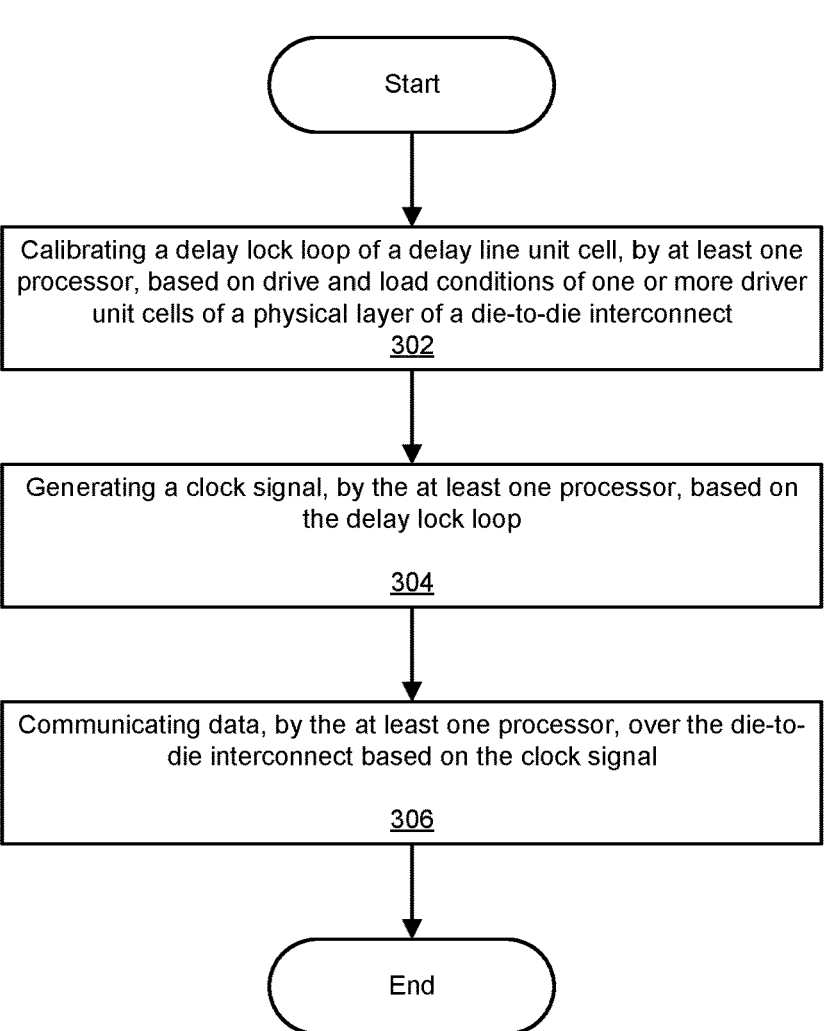

```
            ┌───────────────┐
            │     Start      │
            └───────────────┘
                    │
                    ▼
┌─────────────────────────────────────────────┐
│ Calibrating a delay lock loop of a delay line │
│ unit cell, by at least one processor, based on │
│ drive and load conditions of one or more driver│
│ unit cells of a physical layer of a die-to-die │
│              interconnect                      │
│                   302                          │
└─────────────────────────────────────────────┘
                    │
                    ▼
┌─────────────────────────────────────────────┐
│ Generating a clock signal, by the at least one │
│    processor, based on the delay lock loop     │
│                                                │
│                   304                          │
└─────────────────────────────────────────────┘
                    │
                    ▼
┌─────────────────────────────────────────────┐
│ Communicating data, by the at least one        │
│ processor, over the die-to-die interconnect    │
│           based on the clock signal            │
│                   306                          │
└─────────────────────────────────────────────┘
                    │
                    ▼
            ┌───────────────┐
            │      End       │
            └───────────────┘
```

*FIG. 3*

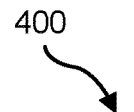
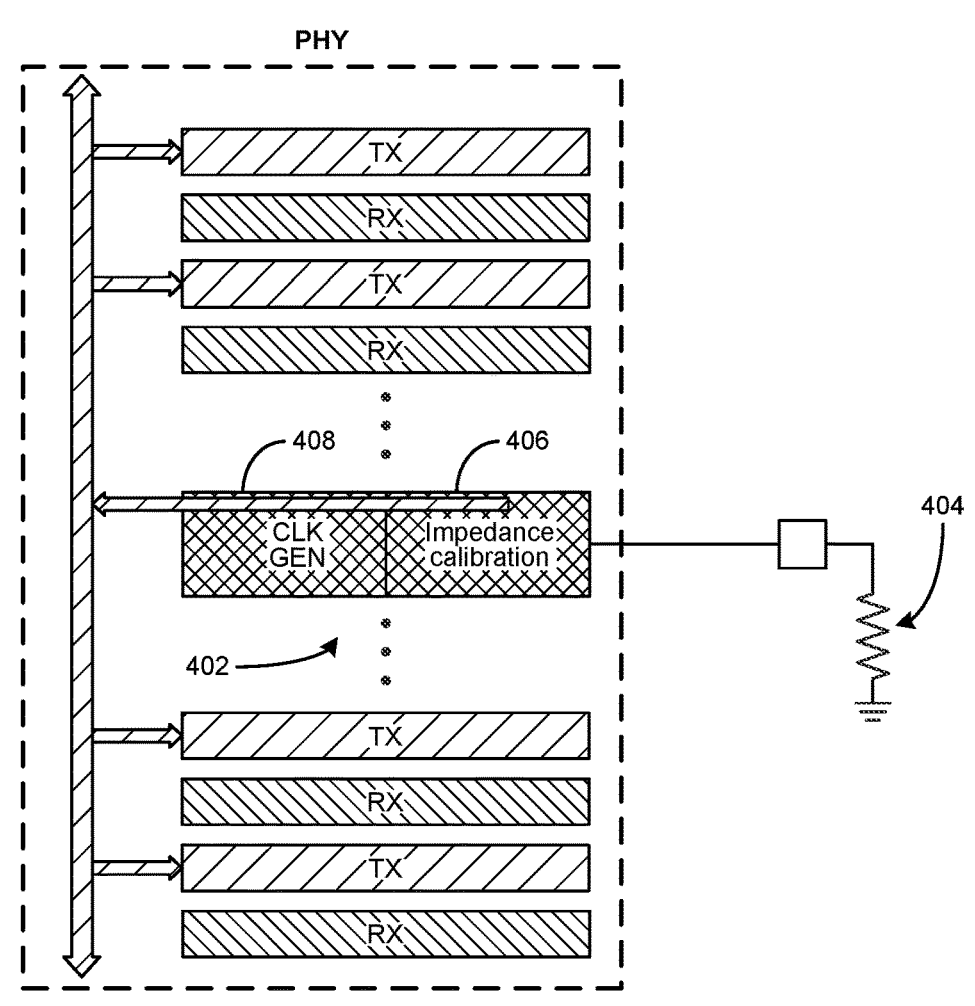
*FIG. 4*

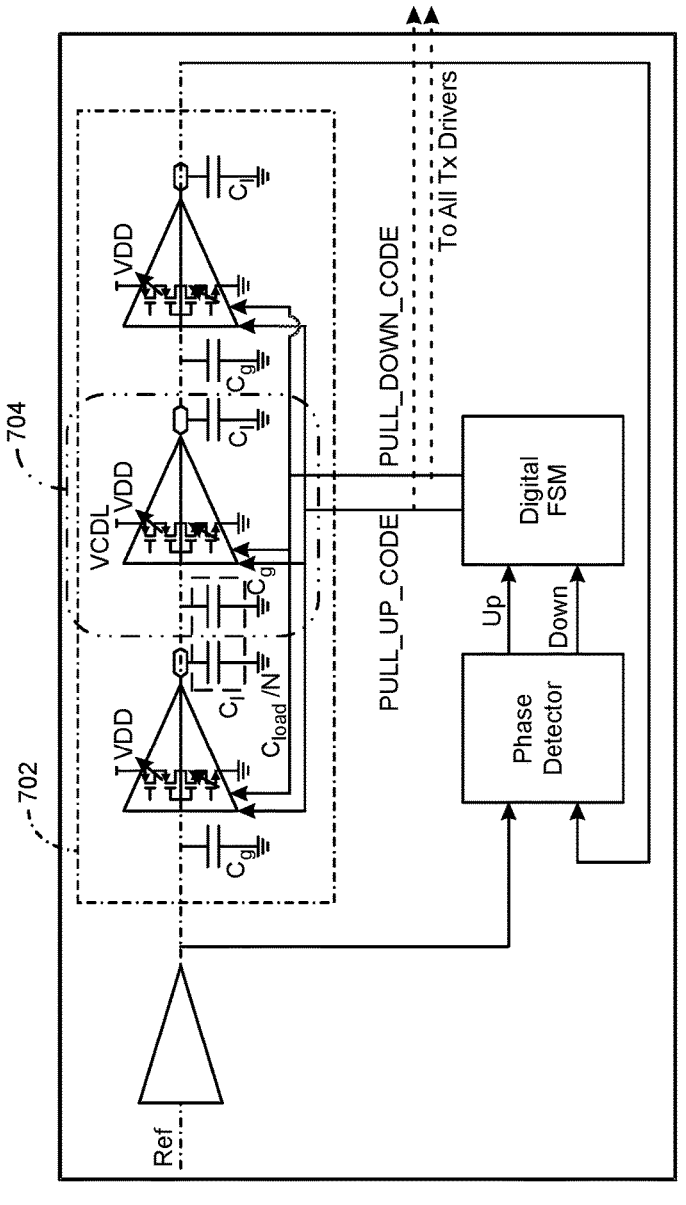
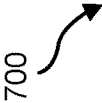
*FIG. 7*

SYSTEMS AND METHODS FOR DRIVER CALIBRATION IN DIE-TO-DIE INTERFACES

BACKGROUND

Impedance calibration of a transmitter (Tx) driver is a quintessential requirement for high-speed input/output (IO) interfaces. Interfaces like quad data rate (QDR), single data rate (SDR), and double data rate single side band (DDRSSB) can benefit by avoiding area/cost overhead of a scheduling (ZCAL) block and overall ease of physical layer (PHY) construction. In many high-speed short channel interfaces, complementary metal-oxide semiconductor (CMOS) based Tx drivers can be preferred as they can provide a compact area for a given drive strength. Typically, a centralized impedance calibration block can be used to calibrate a reference Tx driver against an on-package resistor or an on-die precision resistor (ODPR). Once calibrated, the drive strength calibration codes can be broadcast to other Tx drivers of a PHY of a die-to-die interface, thus programing each transmitter driver for desired output impedance.

BRIEF DESCRIPTION OF THE DRAWINGS

The accompanying drawings illustrate a number of exemplary implementations and are a part of the specification. Together with the following description, these drawings demonstrate and explain various principles of the present disclosure.

FIG. 3 is a flow diagram of an example method for driver calibration in die-to-die interfaces.

FIG. 4 is a block diagram of an example portion of a die-to-die interface having a reference driver calibrated to a target impedance value using an external reference resistor.

FIG. 7 is a block diagram illustrating a delay lock loop circuit for driver calibration in die-to-die interfaces.

Figure 1:
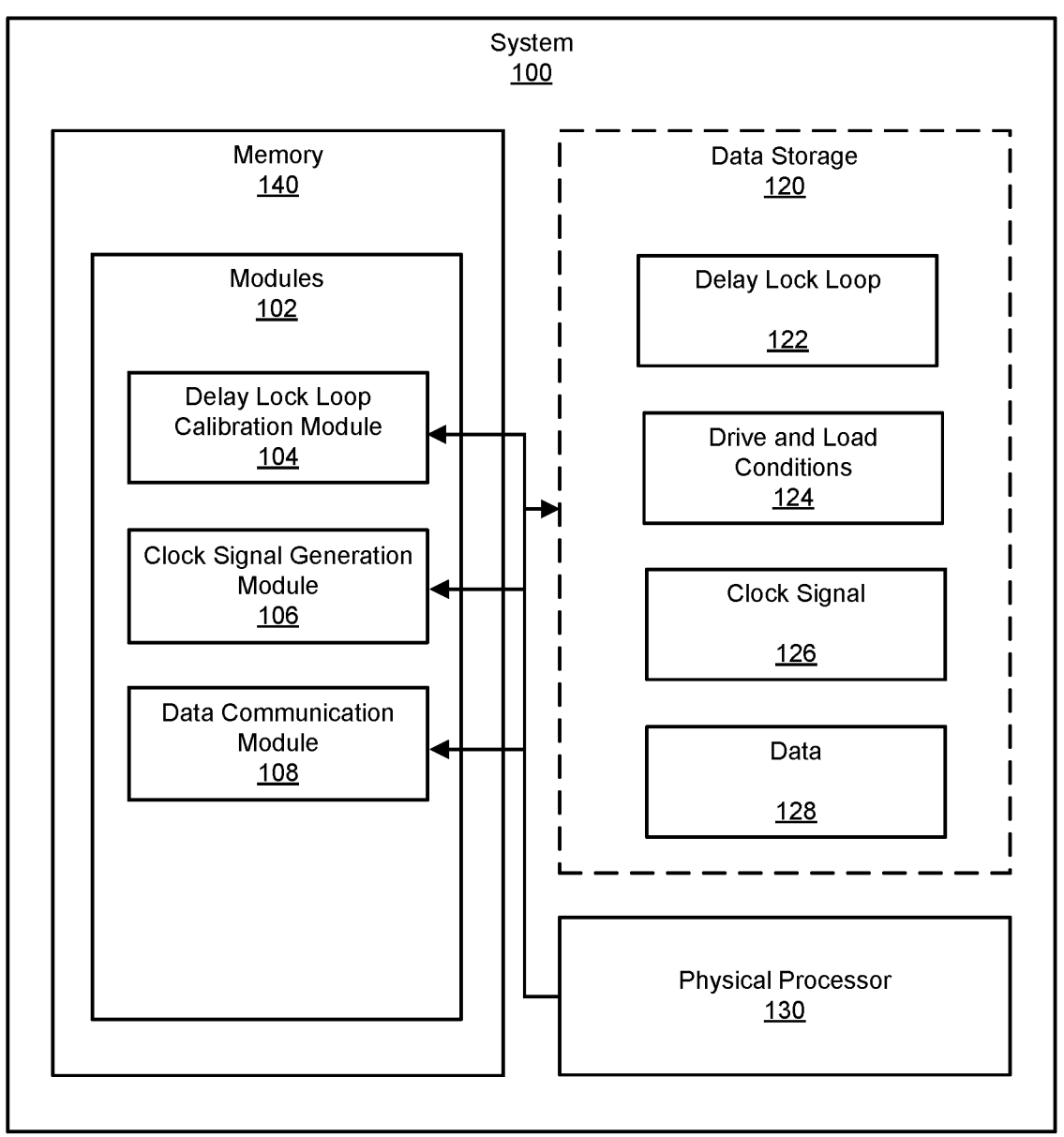
FIG. 1 is a block diagram of an example system for driver calibration in die-to-die interfaces.

Throughout the drawings, identical reference characters and descriptions indicate similar, but not necessarily identical, elements. While the examples described herein are susceptible to various modifications and alternative forms, specific implementations have been shown by way of example in the drawings and will be described in detail herein. However, the example implementations described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to driver calibration in die-to-die interfaces. For example, by calibrating a delay lock loop of a delay line unit cell based on drive and load conditions of one or more driver unit cells of a physical layer of a die-to-die interconnect, generating a clock signal based on the delay lock loop, and communicating data over the die-to-die interconnect based on the clock signal, an optimal drive strength across process, voltage, and/or temperature (PVT) variations can be achieved. The disclosed systems and methods also avoid use of a dedicated impedance calibration block, an on-die precision resistor (ODPR), and/or an on-package resistor, thus reducing both silicon area and package cost.

Achieving optimal drive strength across PVT variations can be beneficial for numerous reasons. For example, such an optimal drive strength can achieve a targeted slew rate at every data rate. Additionally, avoiding an aggressive slew rate can avoid consequent increase in power supply noise. Such noise can mandate that a system on chip (SOC) opt for a higher nominal voltage for achieving a certain frequency in a voltage-frequency (V-F) curve, impacting overall system power. The optimal drive strength can also achieve overall supply noise reduction by controlling instantaneous current change (di/dt) from a pad switching at a faster slew rate. Further, faster slew rates can hamper signal integrity with cross-talk induction into neighboring lanes in a channel.

Benefits realized by the disclosed systems and methods manifest in various forms. For example, spatial variations can be addressed by each transmitter phylet deriving its own calibration code from its own delay lock loop (DLL). Additionally, as the DLL runs continuously, the disclosed systems and methods can compensate for dynamic temperature and voltage variations (e.g., based on DLL bandwidth (e.g., data rate)). Also, these factors can result in a more accurate Tx driver impedance and enable higher data rates for CMOS-driver based designs. Further, the transient response-based calibration, as opposed to the traditional single voltage point static impedance calibration, can provide better control on pad slew rate, hence addressing simultaneous switching output (SSO) and supply noise problems in an improved manner. These issues can be more significant in short-reach interfaces (e.g., universal chiplet interconnect express (UCIe), ultra-short reach (USR), double data rate single side band (DDRSSB), quad data rate single side band (QDRSSB), high bandwidth memory (HBM), etc.). Finally, achieving slew rates proportional to data rates facilitates control of supply noise, thus improving optimization of a voltage-frequency (V-F) curve.

Figure 2:
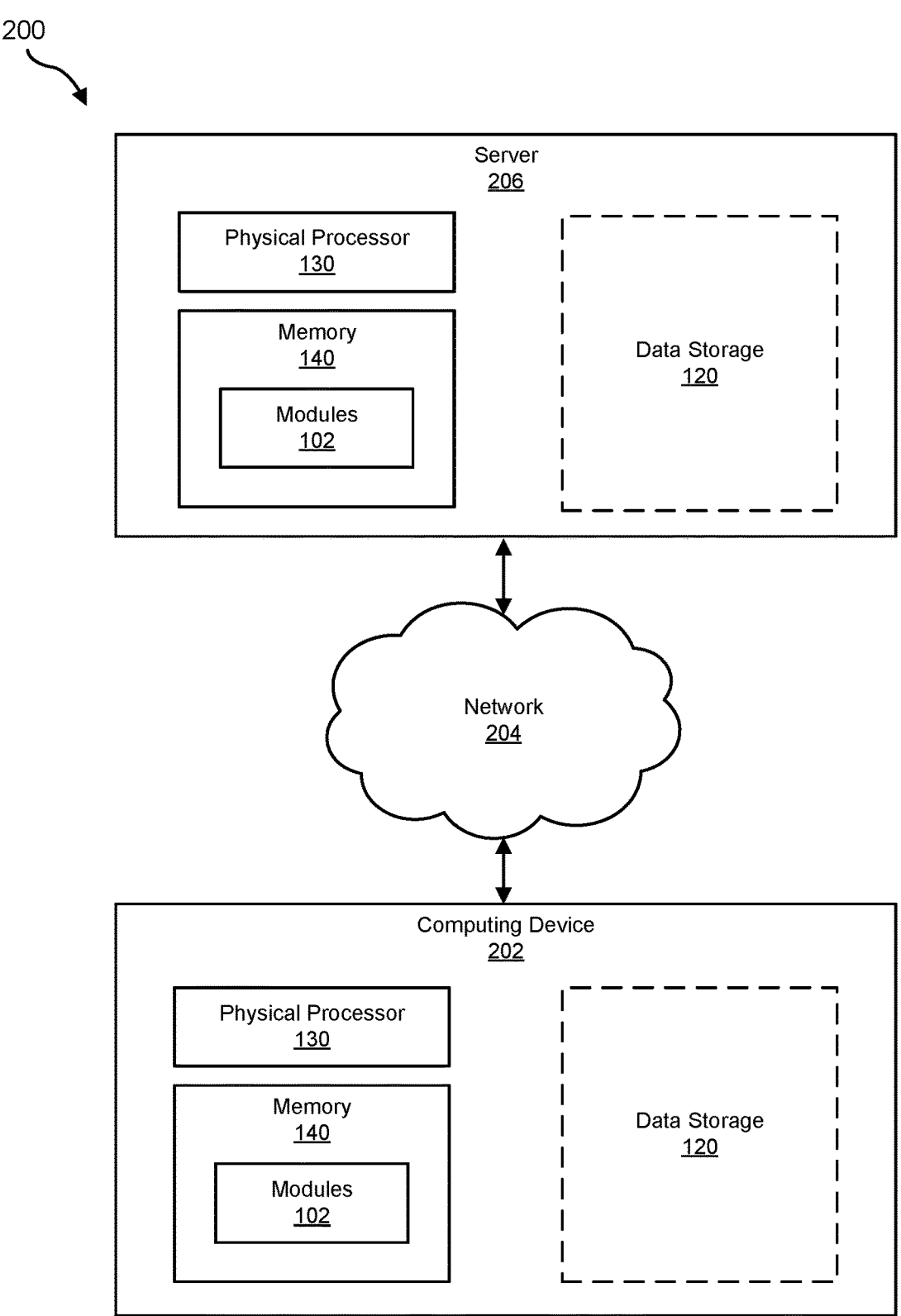
FIG. 2 is a block diagram of an additional example system for driver calibration in die-to-die interfaces.
Figure 5:
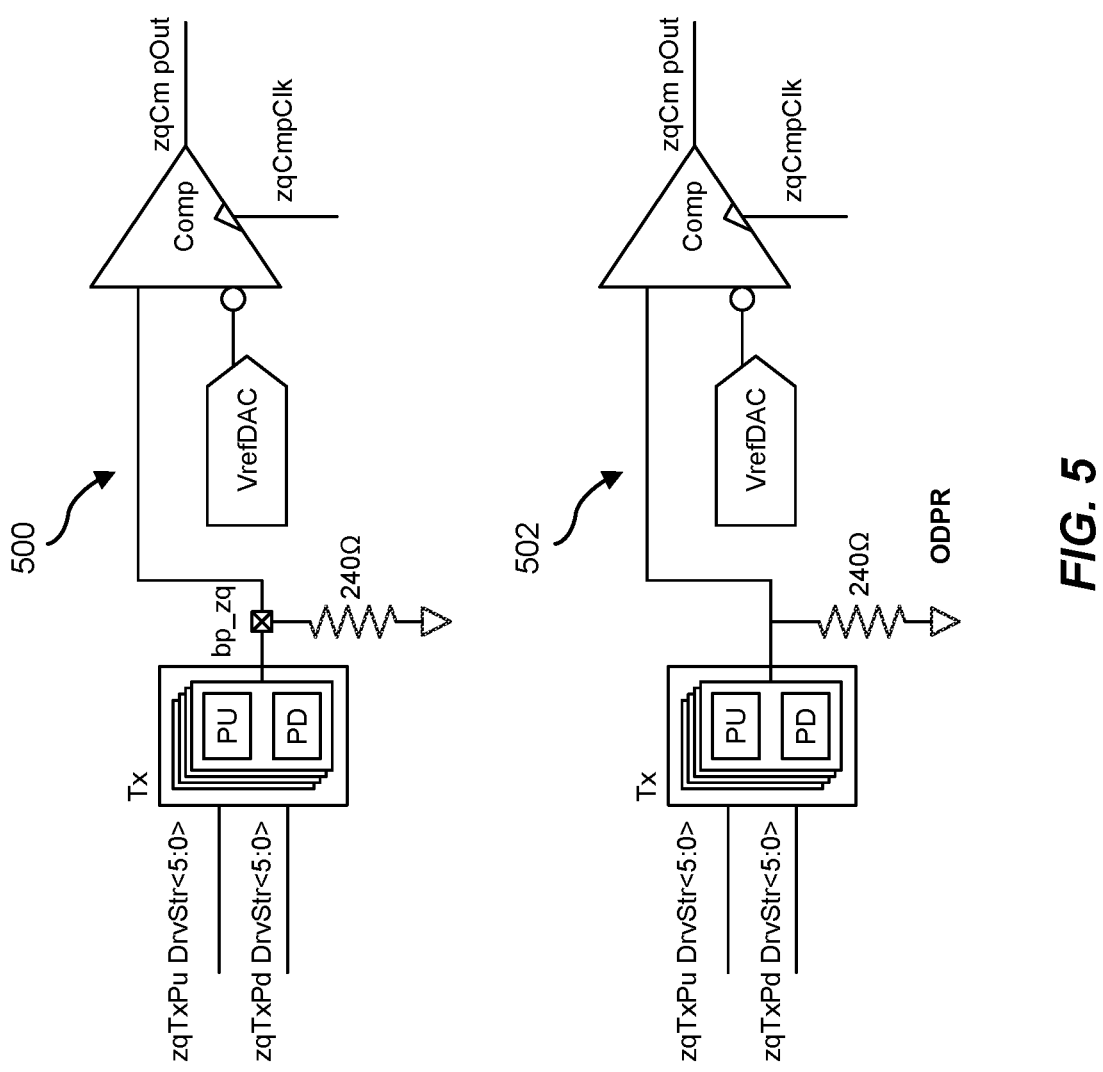
FIG. 5 is a block diagram of example circuits for impedance calibration of a reference driver of a die-to-die interface using an external on package resistor and/or an external on-die resistor.

The following will provide, with reference to FIGS. 1-2, detailed descriptions of example systems for driver calibration in die-to-die interfaces. Detailed descriptions of corresponding computer-implemented methods will also be provided in connection with FIG. 3. In addition, detailed descriptions of an example portion of a die-to-die interface having a reference driver calibrated to a target impedance value using an external reference resistor will be provided in connection with FIGS. 4 and 5. Further, detailed descriptions of an example reference driver including a delay line having a digital delay lock loop for driver calibration in die-to-die interfaces will be provided in connection with FIG. 6. Finally, detailed descriptions of a delay lock loop circuit for driver calibration in die-to-die interfaces will be provided in connection with FIGS. 7 and 8.

In one example, a computing device can include a delay lock loop of a delay line unit cell, wherein the delay lock loop is calibrated based on drive and load conditions of one or more driver unit cells of a physical layer of a die-to-die interconnect, a clock signal generator configured to generate a clock signal based on the delay lock loop, and a plurality of transmitter drivers configured to communicate data over the die-to-die interconnect based on the clock signal.

Another example can be the previously described example computing device, wherein the one or more driver unit cells include a transmitter pre-driver unit cell and a transmitter final driver unit cell.

Another example can be any of the previously described example computing devices, wherein the delay lock loop is calibrated by setting of a unit element of the delay lock loop to reflect drive and load conditions of the transmitter pre-driver unit cell and the transmitter final driver unit cell.

Another example can be any of the previously described example computing devices, wherein the unit element is set to a sum of an inverter drive strength of the delay lock loop and a capacitor load of the delay lock loop.

Another example can be any of the previously described example computing devices, wherein the delay lock loop is configured to broadcast one or more lock codes of the delay lock loop to a plurality of transmitter drivers of the physical layer of the die-to-die interconnect.

Another example can be any of the previously described example computing devices, wherein the delay lock loop is configured to adjust a number of active transistor legs of the delay lock loop in response to at least one of process, voltage, or temperature variations.

Another example can be any of the previously described example computing devices, wherein the delay lock loop is configured to adjust the number of active transistor legs by at least one of causing a closed loop delay of the delay lock loop to equal a reference period by increasing the number of active transistor legs in a slow process corner or relaxing a slew rate of the clock signal in proportion to a data rate frequency by decreasing the number of active transistor legs.

In one example, a system includes at least one physical processor and physical memory comprising computer-executable instructions that, when executed by the at least one physical processor, cause the physical processor to calibrate a delay lock loop of a delay line unit cell based on drive and load conditions of one or more driver unit cells of a physical layer of a die-to-die interconnect, generate a clock signal based on the delay lock loop, and communicate data over the die-to-die interconnect based on the clock signal.

Another example can be the previously described example system, wherein the one or more driver unit cells include a transmitter pre-driver unit cell and a transmitter final driver unit cell.

Another example can be any of the previously described example systems, wherein the computer-executable instructions cause the at least one physical processor to calibrate the delay lock loop at least in part by setting a unit element of the delay lock loop to reflect drive and load conditions of the transmitter pre-driver unit cell and the transmitter final driver unit cell.

Another example can be any of the previously described example systems, wherein the computer-executable instructions cause the at least one physical processor to set the unit element to a sum of an inverter drive strength of the delay lock loop and a capacitor load of the delay lock loop.

Another example can be any of the previously described example systems, wherein the computer-executable instructions cause the at least one physical processor to generate the clock signal at least in part by broadcasting one or more lock codes of the delay lock loop to a plurality of transmitter drivers of the physical layer of the die-to-die interconnect.

Another example can be any of the previously described example systems, wherein the computer-executable instructions cause the at least one physical processor to generate the clock signal at least in part by adjusting a number of active transistor legs of the delay lock loop in response to at least one of process, voltage, or temperature variations.

Another example can be any of the previously described example systems, wherein the computer-executable instructions cause the at least one physical processor to adjust the number of active transistor legs by at least one of causing a closed loop delay of the delay lock loop to equal a reference period by increasing the number of active transistor legs in a slow process corner, or relaxing a slew rate of the clock signal in proportion to a data rate frequency by decreasing the number of active transistor legs.

In one example, a computer-implemented method can include calibrating a delay lock loop of a delay line unit cell, by at least one processor, based on drive and load conditions of one or more driver unit cells of a physical layer of a die-to-die interconnect, generating a clock signal, by the at least one processor, based on the delay lock loop, and communicating data, by the at least one processor, over the die-to-die interconnect based on the clock signal.

Another example can be the previously described example computer-implemented method, wherein the one or more driver unit cells include a transmitter pre-driver unit cell and a transmitter final driver unit cell.

Another example can be any of the previously described example computer-implemented methods, wherein calibrating the delay lock loop includes setting a unit element of the delay lock loop to reflect drive and load conditions of the transmitter pre-driver unit cell and the transmitter final driver unit cell.

Another example can be any of the previously described example computer-implemented methods, wherein the unit element is set to a sum of an inverter drive strength of the delay lock loop and a capacitor load of the delay lock loop.

Another example can be any of the previously described example computer-implemented methods, wherein generating the clock signal includes broadcasting one or more lock codes of the delay lock loop to a plurality of transmitter drivers of the physical layer of the die-to-die interconnect.

Another example can be any of the previously described example computer-implemented methods, wherein generating the clock signal includes adjusting a number of active transistor legs of the delay lock loop in response to at least one of process, voltage, or temperature variations.

FIG. 1 is a block diagram of an example system 100 for driver calibration in die-to-die interfaces. As illustrated in this figure, example system 100 can include one or more modules 102 for performing one or more tasks. As will be explained in greater detail below, modules 102 can include a delay lock loop module 104, a clock signal generation module 106, and a data communication module 108. Although illustrated as separate elements, one or more of modules 102 in FIG. 1 can represent portions of a single module or application.

In certain implementations, one or more of modules 102 in FIG. 1 can represent one or more software applications or programs that, when executed by a computing device, can cause the computing device to perform one or more tasks. For example, and as will be described in greater detail below, one or more of modules 102 can represent modules stored and configured to run on one or more computing devices, such as the devices illustrated in FIG. 2 (e.g., computing device 202 and/or server 206). One or more of modules 102 in FIG. 1 can also represent all or portions of one or more special-purpose computers configured to perform one or more tasks.

As illustrated in FIG. 1, example system 100 can also include one or more memory devices, such as memory 140. Memory 140 generally represents any type or form of volatile or non-volatile storage device or medium capable of storing data and/or computer-readable instructions. In one example, memory 140 can store, load, and/or maintain one or more of modules 102. Examples of memory 140 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

As illustrated in FIG. 1, example system 100 can also include one or more physical processors, such as physical processor 130. Physical processor 130 generally represents any type or form of hardware-implemented processing unit capable of interpreting and/or executing computer-readable instructions. In one example, physical processor 130 can access and/or modify one or more of modules 102 stored in memory 140. Additionally or alternatively, physical processor 130 can execute one or more of modules 102 to facilitate driver calibration in die-to-die interfaces. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

The term "modules," as used herein, can generally refer to one or more functional components of a computing device. For example, and without limitation, a module or modules can correspond to hardware, software, or combinations thereof. In turn, hardware can correspond to analog circuitry, digital circuitry, communication media, or combinations thereof. In some implementations, the modules can be implemented as microcode (e.g., a collection of instructions running on a micro-processor, digital and/or analog circuitry, etc.) and/or one or more firmware in a graphics processing unit. For example, a module can correspond to a GPU, a trusted micro-processor of a GPU, and/or a portion thereof (e.g., circuitry (e.g., one or more device features sets and/or firmware) of a trusted micro-processor).

As illustrated in FIG. 1, example system 100 can also include one or more instances of stored data, such as data storage 120. Data storage 120 generally represents any type or form of stored data, however stored (e.g., signal line transmissions, bit registers, flip flops, software in rewritable memory, configurable hardware states, combinations thereof, etc.). In one example, data storage 120 includes databases, spreadsheets, tables, lists, matrices, trees, or any other type of data structure. Examples of data storage include, without limitation, delay lock loop 122, drive and load conditions 124, clock signal 126, and data 128.

Example system 100 in FIG. 1 can be implemented in a variety of ways. For example, all or a portion of example system 100 can represent portions of example system 200 in FIG. 2. As shown in FIG. 2, system 200 can include a computing device 202 in communication with a server 206 via a network 204. In one example, all or a portion of the functionality of modules 102 can be performed by computing device 202, server 206, and/or any other suitable computing system. As will be described in greater detail below, one or more of modules 102 from FIG. 1 can, when executed by at least one processor of computing device 202 and/or server 206, enable computing device 202 and/or server 206 to facilitate driver calibration in die-to-die interfaces.

Computing device 202 generally represents any type or form of computing device capable of reading computer-executable instructions. In some implementations, computing device 202 can be and/or include one or more graphics processing units having a chiplet processor connected by a switch fabric. Additional examples of computing device 202 include, without limitation, platforms such as laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things devices (e.g., smart appliances, etc.), gaming consoles, variations or combinations of one or more of the same, or any other suitable computing device. Alternatively or additionally, computing device 202 can correspond to a device operating within such a platform.

Server 206 generally represents any type or form of platform that provides cloud service (e.g., cloud gaming server) that includes one or more computing devices 202. In some implementations, server 206 can be and/or include a cloud service (e.g., cloud gaming server) that includes one or more graphics processing units having a chiplet processor connected by a switch fabric. Additional examples of server 206 include, without limitation, storage servers, database servers, application servers, and/or web servers configured to run certain software applications and/or provide various storage, database, and/or web services. Although illustrated as a single entity in FIG. 2, server 206 can include and/or represent a plurality of servers that work and/or operate in conjunction with one another.

Network 204 generally represents any medium or architecture capable of facilitating communication or data transfer. In one example, network 204 can facilitate communication between computing device 202 and server 206. In this example, network 204 can facilitate communication or data transfer using wireless and/or wired connections. Examples of network 204 include, without limitation, a Peripheral Component Interconnect express (PICe) bus, a Nonvolatile memory express (Nvme) bus, a Local Area Network (LAN), a Personal Area Network (PAN), Power Line Communications (PLC), portions of one or more of the same, variations or combinations of one or more of the same, or any other suitable network that enables the computing device 202 to perform data communication with other components on the platform of server 206. In other examples, network 204 can be an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

Many other devices or subsystems can be connected to system 100 in FIG. 1 and/or system 200 in FIG. 2. Conversely, all of the components and devices illustrated in FIGS. 1 and 2 need not be present to practice the implementations described and/or illustrated herein. The devices and subsystems referenced above can also be interconnected in different ways from that shown in FIG. 2. Systems 100 and 200 can also employ any number of software, firmware, and/or hardware configurations. For example, one or more of the example implementations disclosed herein can be encoded as a computer program (also referred to as computer software, software applications, computer-readable instructions, and/or computer control logic) on a computer-readable medium.

The term "computer-readable medium," as used herein, can generally refer to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

FIG. 3 is a flow diagram of an example computer-implemented method 300 for driver calibration in die-to-die interfaces. The steps shown in FIG. 3 can be performed by any suitable computer-executable code and/or computing system, including system 100 in FIG. 1, system 200 in FIG. 2, and/or variations or combinations of one or more of the same. In one example, each of the steps shown in FIG. 3 can represent an algorithm whose structure includes and/or is represented by multiple sub-steps, examples of which will be provided in greater detail below.

The term "computer-implemented method," as used herein, can generally refer to a method performed by hardware or a combination of hardware and software. For example, hardware can correspond to analog circuitry, digital circuitry, communication media, or combinations thereof. In some implementations, hardware can correspond to digital and/or analog circuitry arranged to carry out one or more portions of the computer-implemented method. In some implementations, hardware can correspond to physical processor 130 of FIG. 1. Additionally, software can correspond to software applications or programs that, when executed by the hardware, can cause the hardware to perform one or more tasks that carry out one or more portions of the computer-implemented method. In some implementations, software can correspond to one or more of modules 102 stored in memory 140 of FIG. 1.

As illustrated in FIG. 3, at step 302 one or more of the systems described herein can calibrate a delay lock loop. For example, delay lock loop calibration module 104 can, as part of computing device 202 in FIG. 2, calibrate a delay lock loop of a delay line unit cell, by at least one processor, based on drive and load conditions of one or more driver unit cells of a physical layer of a die-to-die interconnect.

The term "calibrate," as used herein, can generally refer to adjusting precisely for a particular function. For example, and without limitation, calibrate can refer to setting a delay element (e.g., programmable transistor) of a digital delay lock loop based on one or more parameters (e.g., resistance, impedance, inverter drive strength, capacitor load, etc.)

The term "delay lock loop," as used herein, can generally refer to a digital circuit that provides high-bandwidth data transmission rates between devices. For example, and without limitation, delay lock loop transmissions can have no propagation delay, low clock skew between output clock signals, and advanced clock domain control. A delay lock loop can be similar to a phase-lock loop except that it does not include an internal voltage-controlled oscillator.

The term "delay line unit cell," as used herein, can generally refer to a delay element of a delay lock loop. For example, and without limitation, a digital delay lock loop can be configured as a closed loop of inverters with programmable drive strength, and this drive strength can be calibrated to match a loop delay to one clock cycle period. In this context, a delay element for the digital delay lock loop circuit can correspond to a programmable transistor with a unit capacitor load.

The term "drive and load conditions," as used herein," can generally refer to electrical characteristics of one or more transmitter drivers. For example, drive and load conditions can refer to an inverter drive strength of a transmitter pre-driver and a capacitor load of a transmitter final driver.

The term "driver unit cells," as used herein, can generally refer to one or more transmitter drivers. For example, and without limitation, driver unit cells can refer to a transmitter pre-driver and a transmitter final driver.

The term "physical layer," as used herein, can generally refer to an interface that defines a relationship between a device and a transmission medium. For example, and without limitation, a physical layer can handle the data flow rate of the data to be transmitted along with the timeframe of the transmitted data. In this context, a "Tx phylet" can be a portion of a physical layer (e.g., an interface of a particular die of a chiplet, an interface of a particular chiplet, etc.).

The term "die-to-die interconnect," as used herein, can generally refer to a combination of a physical layer and a controller block that provides a data interface between two silicon dies that are assembled in a same package. For example, and without limitation, a die-to-die interconnect can take advantage of very short channels to connect two dies inside a package to achieve power efficiency and high bandwidth efficiency.

The systems described herein can perform step 304 in a variety of ways. In one example, delay lock loop calibration module 104 can, as part of computing device 202 in FIG. 2, calibrate a delay lock loop of a delay line unit cell based on drive and load conditions of one or more driver unit cells that include a transmitter pre-driver unit cell and a transmitter final driver unit cell. In some of these examples, delay lock loop calibration module 104 can, as part of computing device 202 in FIG. 2, calibrate the delay lock loop at least in part by setting a unit element of the delay lock loop to reflect drive and load conditions of the transmitter pre-driver unit cell and the transmitter final driver unit cell. In some of these examples, delay lock loop calibration module 104 can, as part of computing device 202 in FIG. 2, calibrate the delay lock loop at least in part by setting the unit element to a sum of an inverter drive strength of the delay lock loop and a capacitor load of the delay lock loop.

At step 304 one or more of the systems described herein can generate a clock signal. For example, clock signal generation module 106 can, as part of computing device 202 in FIG. 2, generate a clock signal, by the at least one processor, based on the delay lock loop.

The term "clock signal," as used herein, can generally refer to an electronic logic signal (e.g., voltage or current). For example, and without limitation, a clock signal can oscillate between a high and a low state at a constant frequency and can be used like a metronome to synchronize actions of digital circuits. In this context, a delay lock loop can be used to change the phase of a clock signal (e.g., a signal with a periodic waveform), usually to enhance the clock rise-to-data output valid timing characteristics of integrated circuits.

The systems described herein can perform step 304 in a variety of ways. In one example, clock signal generation module 106 can, as part of computing device 202 in FIG. 2, generate the clock signal at least in part by broadcasting one or more lock codes of the delay lock loop to a plurality of transmitter drivers of the physical layer of the die-to-die interconnect. Additionally or alternatively, clock signal generation module 106 can, as part of computing device 202 in FIG. 2, generate the clock signal at least in part by adjusting a number of active transistor legs of the delay lock loop in response to at least one of process, voltage, or temperature variations. In some of these examples, clock signal generation module 106 can, as part of computing device 202 in FIG. 2, adjust the number of active transistor legs by causing a closed loop delay of the delay lock loop to equal a reference period by increasing the number of active transistor legs in a slow process corner. Alternatively or additionally, clock signal generation module 106 can, as part of computing device 202 in FIG. 2, relax a slew rate of the clock signal in proportion to a data rate frequency by decreasing the number of active transistor legs.

At step 306 one or more of the systems described herein can communicate data. For example, data communication module 108 can, as part of computing device 202 in FIG. 2, communicate data, by the at least one processor, over the die-to-die interconnect based on the clock signal.

The term "communicate data," as used herein, can generally refer to using computing and communication technologies to transfer data from one place to another. For example, and without limitation, communication data can include placing data in a transmitter buffer and transmitting the data over a communication medium (e.g., redistribution layers of a semiconductor wafer, substrate die, interposer, etc.).

The systems described herein can perform step 306 in a variety of ways. In one example, data communication module 108 can, as part of computing device 202 in FIG. 2, generate and/or receive the data and store the data in transmitter buffers coupled to a plurality of transmitters of the die-to-die interconnect.

FIG. 4 is a block diagram of an example portion 400 of a die-to-die interface having a reference driver 402 calibrated to a target impedance value using an external reference resistor 404. In a typical approach, the reference driver can be calibrated to a target impedance value by using an external on-package resistor (Rref) 500 of FIG. 5 or an on-die precision resistor 502 of FIG. 5. This impedance calibration training 406 can typically be performed during an initialization phase. Sometimes, another step of periodic calibration can also be performed to compensate for dynamic voltage and temperature variations. Once the calibration training 406 is completed, a clock signal generator 408 of the reference driver 402 can broadcast resulting calibration codes to all Tx Phylets across an entire PHY.

This typical approach can suffer from a few disadvantages. For example, periodic short calibration can be required to compensate for any dynamic temperature variation, but this periodic calibration requires additional firmware effort. Additionally, any systematic spatial variations can result in an error in driver impedance. For larger PHYs (e.g., USR PHY) in which PHY height can be more than two millimeters on one side, error due to systematic variation and lane-to-lane channel mismatches can also be significant and can result in loss of significant eye margin (e.g., approximately around 20%). Error introduced by dynamic/static voltage variation can further be significant and is not addressed in this typical approach. Moreover, usage of an on-package resistor (e.g., requiring an extra bump) can be expensive in terms of silicon area and package cost. As a result, this typical approach can be too costly for simpler die-to-die interfaces (e.g., USR PHY, QDR/DDRSSB, UCIe, etc.).

Figure 6:
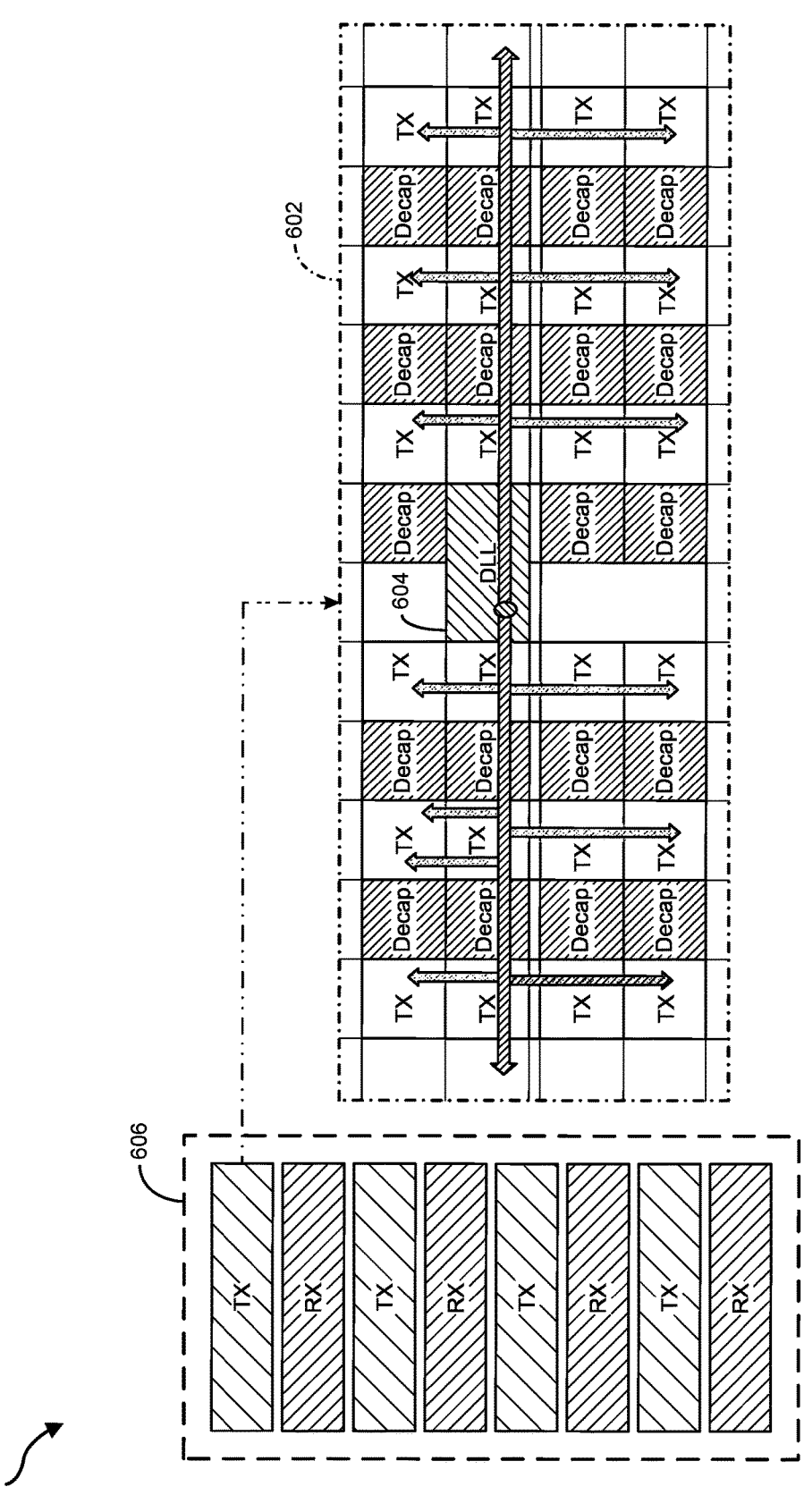
FIG. 6 is a block diagram of an example reference driver including a delay line having a digital delay lock loop for driver calibration in die-to-die interfaces.

FIG. 6 shows an example portion 600 of a die-to-die interface including a delay line 602 having a digital delay lock loop 604 for driver calibration in die-to-die interfaces.

For example, a DDRSSB Tx phylet 606 can use a digital DLL 604 to generate an in-phase clock signal for serialization.

Figure 8:
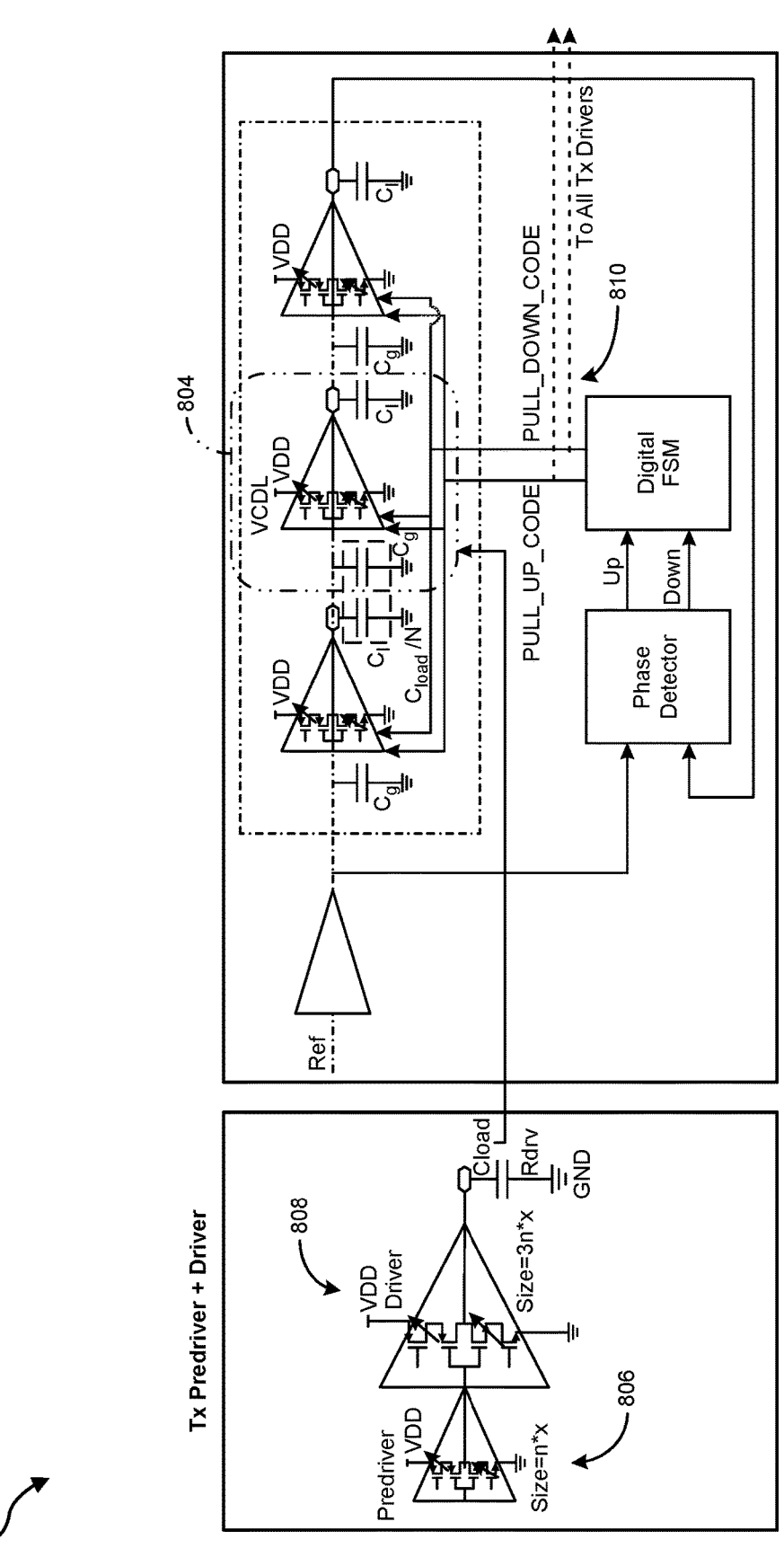
FIG. 8 is a block diagram illustrating a delay lock loop circuit for driver calibration in die-to-die interfaces.

Referring generally to FIGS. 7 and 8, a digital delay lock loop circuit 700 and 800 for driver calibration in die-to-die interfaces is shown. A typical digital DLL circuit 700 can be implemented as a closed loop of inverters 702 with programmable drive strength, and this drive strength can be calibrated to match a loop delay to one clock cycle period. A delay element 704 for the digital DLL circuit 700 can typically be or include a programmable transistor with a unit capacitor load.

Referring particularly to FIG. 8, the disclosed systems and methods can choose the delay element 804 of the digital DLL circuit 800 as inverter plus capacitor load, which can reflect drive and load conditions of a pre-driver 806 and a transmitter final driver 808. By choosing the delay element 804 in this manner, digital DLL calibration codes 810 can serve as an indicator of a drive strength of a CMOS inverter. Thus, in slow corners, the digital DLL circuit 800 can lock to higher drive strength codes and these same high codes can be used to achieve a target impedance in a transmitter driver in the slow process corner. Broadcasting these digital DLL calibration codes 810 to all transmitter drivers in a Tx phylet can provide targeted slew rates across PVT variations.

In this way, the delay line unit cell (e.g., delay element 804) can truly reflect transient behavior of the transmitter driver and pre-driver and also aid in dynamic/AC resistance compensation. Additionally, drive strength of the digital DLL unit cell can track PVT variations to lock the digital DLL to a specific frequency target. For example, at a slow process corner, a programmable number of transistor legs can be increased to keep a closed loop delay the same as a reference period. In some of these examples, the same drive strength can be re-used as Tx driver and pre-driver codes to target a specific slew rate at pad and pre-pad outputs. Similarly, for lower frequencies, a lesser number of legs can be turned on in the digital DLL to aid in meeting relaxed slew-rates at pad and pre-pad outputs at low speed operation. Also, controlled slew rates can aid in generating better simultaneous switching output (SSO) noise profile and/or lower supply noise, which can improve signal and power integrity. Moreover, with one digital DLL per phylet, driver calibration using DLL codes can address systematic spatial process variation of drive strength, which can aid in reducing lane-to-lane skew.

As set forth above, by calibrating a delay lock loop of a delay line unit cell based on drive and load conditions of one or more driver unit cells of a physical layer of a die-to-die interconnect, generating a clock signal based on the delay lock loop, and communicating data over the die-to-die interconnect based on the clock signal, an optimal drive strength across process, voltage, and/or temperature (PVT) variations can be achieved. The disclosed systems and methods also avoid use of a dedicated impedance calibration block, an on-die precision resistor (ODPR), and/or an on-package resistor, thus reducing both silicon area and package cost.

Achieving optimal drive strength across PVT variations can be beneficial for numerous reasons. For example, such an optimal drive strength can achieve a targeted slew rate at every data rate. Additionally, avoiding an aggressive slew rate can avoid consequent increase in power supply noise. Such noise can mandate that a system on chip (SOC) opt for a higher nominal voltage for achieving a certain frequency in a voltage-frequency (V-F) curve, impacting overall system power. The optimal drive strength can also achieve overall supply noise reduction by controlling instantaneous current change (di/dt) from a pad switching at a faster slew rate. Further, faster slew rates can hamper signal integrity with cross-talk induction into neighboring lanes in a channel.

Benefits realized by the disclosed systems and methods manifest in various forms. For example, spatial variations can be addressed by each transmitter phylet deriving its own calibration code from its own delay lock loop (DLL). Additionally, as the DLL runs continuously, the disclosed systems and methods can compensate for dynamic temperature and voltage variations (e.g., based on DLL bandwidth (e.g., data rate)). Also, these factors can result in in a more accurate Tx driver impedance and enable higher data rates for CMOS-driver based designs. Further, the transient response-based calibration, as opposed to the traditional single voltage point static impedance calibration, can provide better control on pad slew rate, hence addressing simultaneous switching output (SSO) and supply noise problems in an improved manner. These issues can be more significant in short-reach interfaces (e.g., universal chiplet interconnect express (UCIe), ultra-short reach (USR), double data rate single side band (DDRSSB), quad data rate single side band (QDRSSB), high bandwidth memory (HBM), etc.). Finally, achieving slew rates proportional to data rates facilitates control of supply noise, thus improving optimization of a voltage-frequency (V-F) curve.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

In some examples, all or a portion of example system 100 in FIG. 1 can represent portions of a cloud-computing or network-based environment. Cloud-computing environments can provide various services and applications via the Internet. These cloud-based services (e.g., software as a service, platform as a service, infrastructure as a service, etc.) can be accessible through a web browser or other remote interface. Various functions described herein can be provided through a remote desktop environment or any other cloud-based computing environment.

In various implementations, all or a portion of example system 100 in FIG. 1 can facilitate multi-tenancy within a cloud-based computing environment. In other words, the modules described herein can configure a computing system (e.g., a server) to facilitate multi-tenancy for one or more of the functions described herein. For example, one or more of the modules described herein can program a server to enable two or more clients (e.g., customers) to share an application that is running on the server. A server programmed in this manner can share an application, operating system, processing system, and/or storage system among multiple customers (i.e., tenants). One or more of the modules described herein can also partition data and/or configuration information of a multi-tenant application for each customer such that one customer cannot access data and/or configuration information of another customer.

According to various implementations, all or a portion of example system 100 in FIG. 1 can be implemented within a virtual environment. For example, the modules and/or data described herein can reside and/or execute within a virtual machine. As used herein, the term "virtual machine" can generally refer to any operating system environment that is abstracted from computing hardware by a virtual machine manager (e.g., a hypervisor).

In some examples, all or a portion of example system 100 in FIG. 1 can represent portions of a mobile computing environment. Mobile computing environments can be implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments can have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein can be provided for a mobile computing environment and/or can interact with a mobile computing environment.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computing device, comprising:
   a delay lock loop of a delay line unit cell, wherein the delay lock loop includes a unit element, wherein the unit element is configured to introduce a fixed delay to a clock signal input into the delay lock loop;
   wherein the unit element includes an inverter and a capacitor load; and
   wherein the delay lock loop is calibrated based on drive and load conditions of one or more driver unit cells of a physical layer of a die-to-die interconnect;
   a clock signal generator configured to generate the clock signal based on the delay lock loop; and
   a plurality of transmitter drivers configured to communicate data over the die-to-die interconnect based on the clock signal.

2. The computing device of claim 1, wherein the one or more driver unit cells include a transmitter pre-driver unit cell and a transmitter final driver unit cell.

3. The computing device of claim 2, wherein the delay lock loop is calibrated by setting of a unit element of the delay lock loop to reflect drive and load conditions of the transmitter pre-driver unit cell and the transmitter final driver unit cell.

4. The computing device of claim 3, wherein the unit element is set to a sum of an inverter drive strength of the delay lock loop and a capacitor load of the delay lock loop.

5. The computing device of claim 1, wherein the delay lock loop is configured to broadcast one or more lock codes of the delay lock loop to a plurality of transmitter drivers of the physical layer of the die-to-die interconnect.

6. The computing device of claim 1, wherein the delay lock loop is configured to adjust a number of active transistor legs of the delay lock loop in response to at least one of process, voltage, or temperature variations.

7. The computing device of claim 6, wherein the delay lock loop is configured to adjust the number of active transistor legs by at least one of:
   causing a closed loop delay of the delay lock loop to equal a reference period by increasing the number of active transistor legs in a slow process corner; or
   relaxing a slew rate of the clock signal in proportion to a data rate frequency by decreasing the number of active transistor legs.

8. A system comprising:
   at least one physical processor; and
   physical memory comprising computer-executable instructions that, when executed by the at least one physical processor, cause the at least one physical processor to:
      calibrate a delay lock loop of a delay line unit cell based on drive and load conditions of one or more driver unit cells of a physical layer of a die-to-die interconnect;
      generate a clock signal based on the delay lock loop; and
      communicate data over the die-to-die interconnect based on the clock signal;
   wherein the delay lock loop is calibrated by setting a unit element of the delay lock loop to a sum of an inverter drive strength of the delay lock and a capacitor load of the delay lock loop.

9. The system of claim 8, wherein the one or more driver unit cells include a transmitter pre-driver unit cell and a transmitter final driver unit cell.

10. The system of claim 9, wherein the computer-executable instructions cause the at least one physical processor to calibrate the delay lock loop at least in part by setting a unit element of the delay lock loop to reflect drive and load conditions of the transmitter pre-driver unit cell and the transmitter final driver unit cell.

11. The system of claim 10, wherein the computer-executable instructions cause the at least one physical processor to set the unit element to a sum of an inverter drive strength of the delay lock loop and a capacitor load of the delay lock loop.

12. The system of claim 8, wherein the computer-executable instructions cause the at least one physical processor to generate the clock signal at least in part by broadcasting one or more lock codes of the delay lock loop to a plurality of transmitter drivers of the physical layer of the die-to-die interconnect.

13. The system of claim 8, wherein the computer-executable instructions cause the at least one physical processor to generate the clock signal at least in part by adjusting a number of active transistor legs of the delay lock loop in response to at least one of process, voltage, or temperature variations.

14. The system of claim 13, wherein the computer-executable instructions cause the at least one physical processor to adjust the number of active transistor legs by at least one of:
   causing a closed loop delay of the delay lock loop to equal a reference period by increasing the number of active transistor legs in a slow process corner; or
   relaxing a slew rate of the clock signal in proportion to a data rate frequency by decreasing the number of active transistor legs.

15. A computer-implemented method comprising:
   calibrating a delay lock loop of a delay line unit cell, by at least one processor, based on drive and load conditions of one or more driver unit cells of a physical layer of a die-to-die interconnect;
   generating a clock signal, by the at least one processor, based on the delay lock loop; and
   communicating data, by the at least one processor, over the die-to-die interconnect based on the clock signal;
   wherein the delay lock loop is calibrated by setting a unit element of the delay lock loop to a sum of an inverter drive strength of the delay lock and a capacitor load of the delay lock loop.

16. The computer-implemented method of claim 15, wherein the one or more driver unit cells include a transmitter pre-driver unit cell and a transmitter final driver unit cell.

17. The computer-implemented method of claim 16, wherein calibrating the delay lock loop includes setting a unit element of the delay lock loop to reflect drive and load conditions of the transmitter pre-driver unit cell and the transmitter final driver unit cell.

18. The computer-implemented method of claim 17, wherein the unit element is set to a sum of an inverter drive strength of the delay lock loop and a capacitor load of the delay lock loop.

19. The computer-implemented method of claim 15, wherein generating the clock signal includes broadcasting one or more lock codes of the delay lock loop to a plurality of transmitter drivers of the physical layer of the die-to-die interconnect.

20. The computer-implemented method of claim 15, wherein generating the clock signal includes adjusting a number of active transistor legs of the delay lock loop in response to at least one of process, voltage, or temperature variations.

\* \* \* \* \*